United States Patent [19]
Woodworth et al.

[11] Patent Number: 5,977,630
[45] Date of Patent: Nov. 2, 1999

[54] PLURAL SEMICONDUCTOR DIE HOUSED IN COMMON PACKAGE WITH SPLIT HEAT SINK

[75] Inventors: Arthur Woodworth, Surrey; George Pearson, West Sussex; Peter Richard Ewer, Surrey, all of United Kingdom

[73] Assignee: International Rectifier Corp., El Segundo, Calif.

[21] Appl. No.: 08/911,866

[22] Filed: Aug. 15, 1997

[51] Int. Cl.[6] .......................... H01L 23/28; H01L 29/41; H01L 23/36

[52] U.S. Cl. ...................... 257/712; 257/676; 257/666; 257/796; 257/675; 257/693; 257/678

[58] Field of Search ................... 257/678, 675, 257/712, 717, 720, 676, 713, 693, 706, 707, 711, 723, 730, 719, 796, 646, 698; 361/707, 717, 719

[56] References Cited

U.S. PATENT DOCUMENTS

| | | |
|---|---|---|
| 4,503,452 | 3/1985 | Yokozawa et al. ...................... 257/675 |
| 4,617,585 | 10/1986 | Yashi ......................................... 257/675 |
| 4,750,030 | 6/1988 | Hatakeyama .............................. 257/675 |
| 5,019,893 | 5/1991 | Frank et al. .............................. 257/676 |
| 5,406,120 | 4/1995 | Jones ......................................... 257/706 |
| 5,521,429 | 5/1996 | Aono et al. .............................. 257/675 |
| 5,789,817 | 8/1998 | Richards et al. .......................... 257/725 |
| 5,793,106 | 8/1998 | Yasukawa et al. ....................... 257/706 |

Primary Examiner—Alexander Oscar Williams
Attorney, Agent, or Firm—Ostrolenk, Faber, Gerb & Soffen, LLP

[57] ABSTRACT

A plurality of semiconductor die, which may be of diverse size and diverse junction pattern, are fixed to a common lead frame and within a common package. The semiconductor die are mounted on respective main pad areas that are laterally spaced from one another and which have respective heat sinks. The heat sinks extend from the boundary of the device package and form external pins that are available for external connection at the same or at different potentials. Isolated pins are also provided. The device package may be used for high and low side chopper circuits, synchronous regulator circuits, single-mode bridges, and the like.

18 Claims, 13 Drawing Sheets

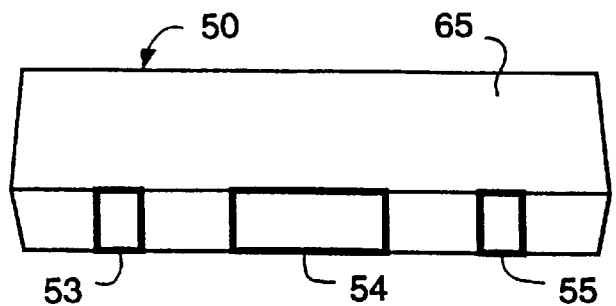
FIG. 3C
FIG. 3A
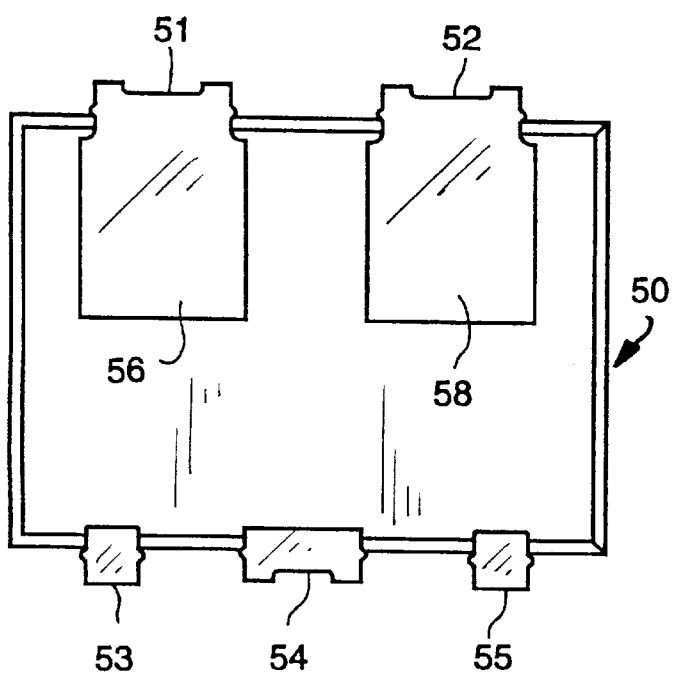
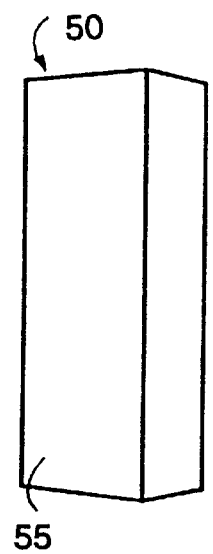
FIG. 3B
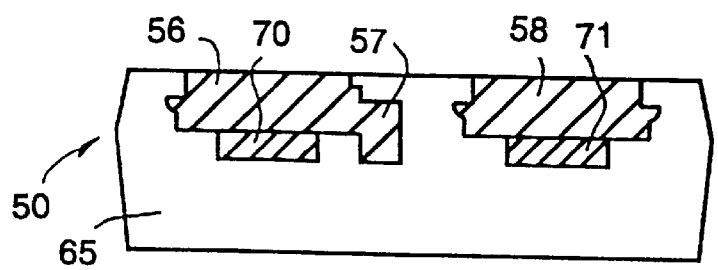
FIG. 3E

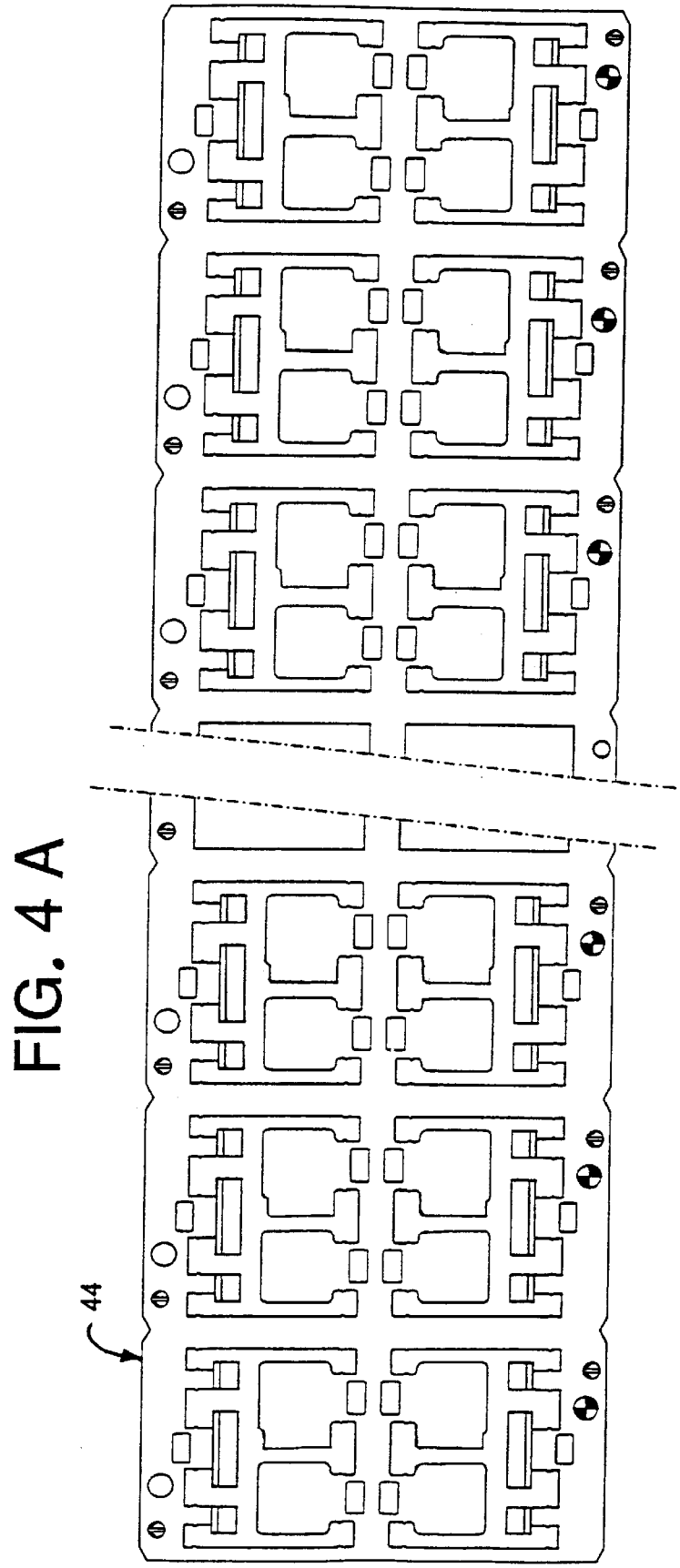

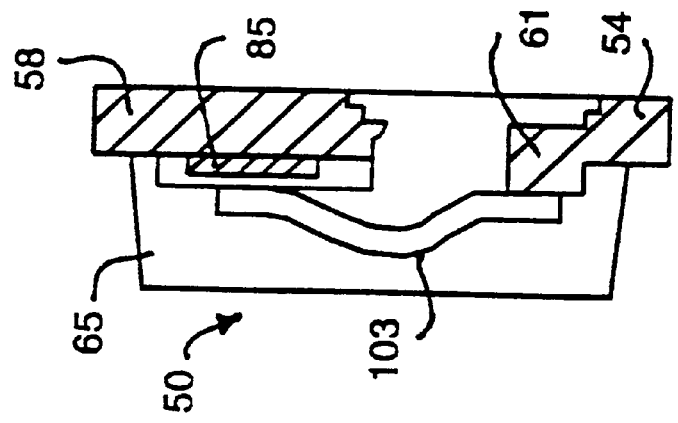
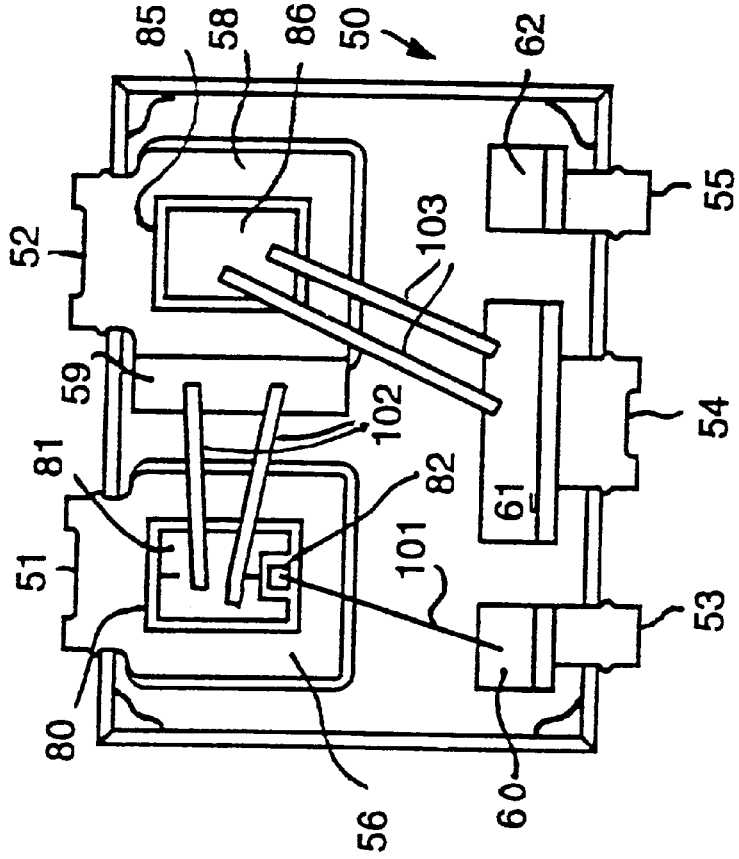

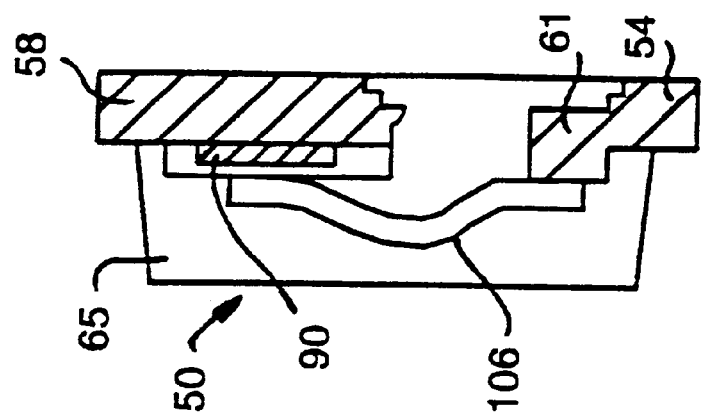
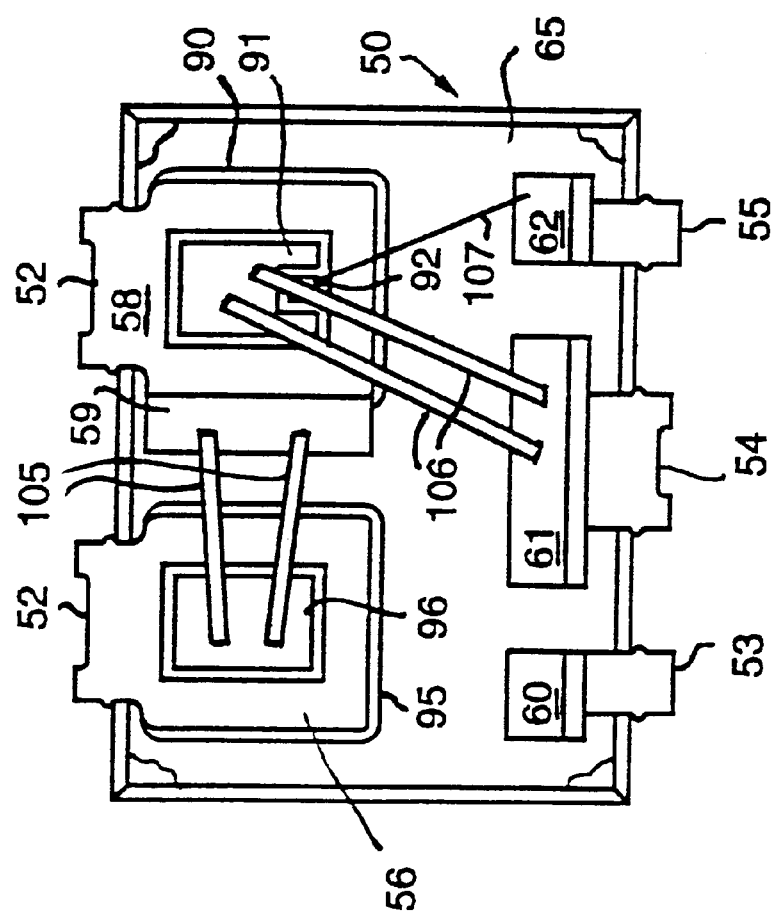

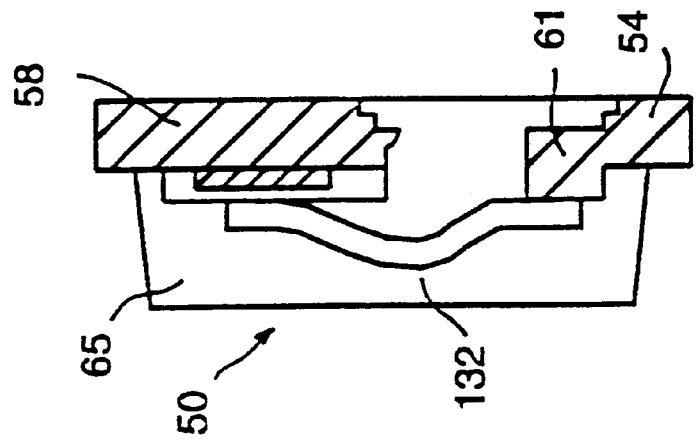
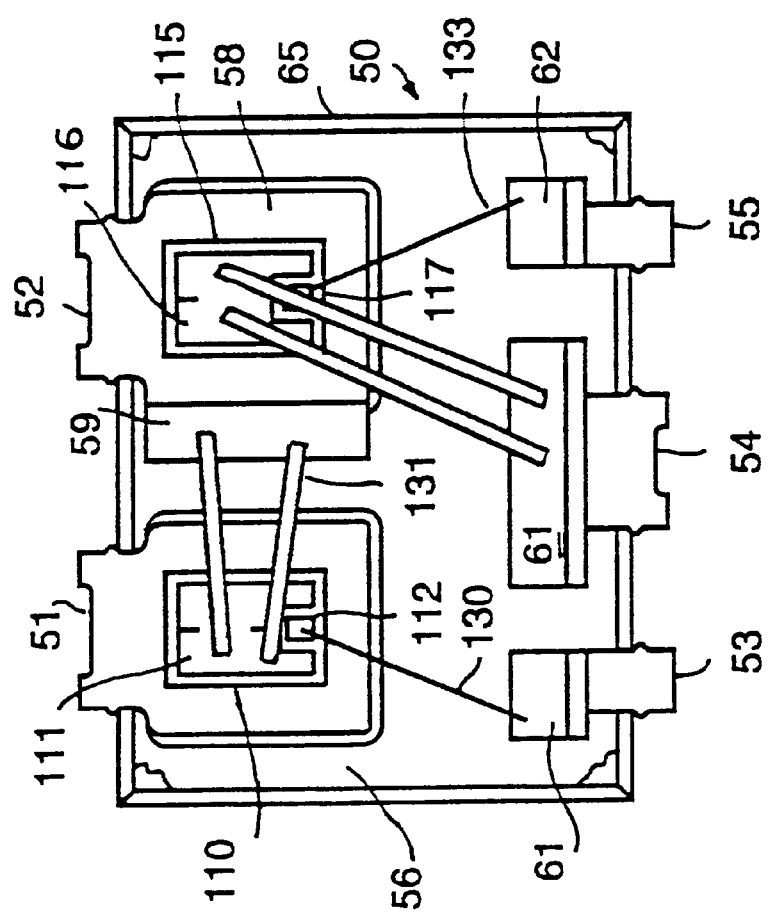

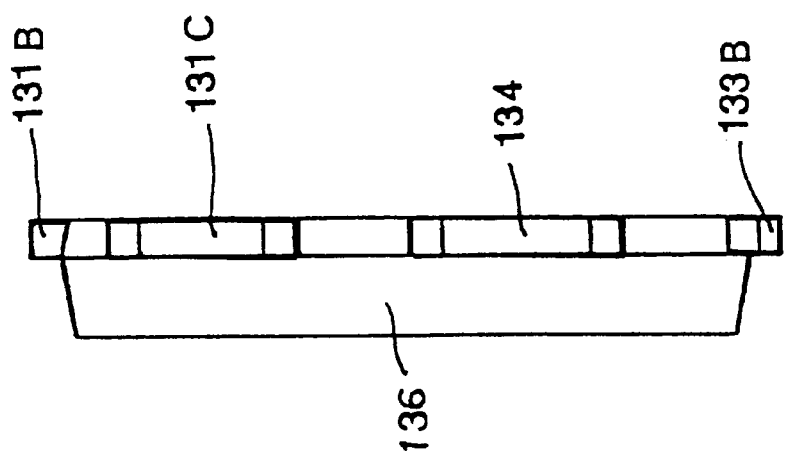
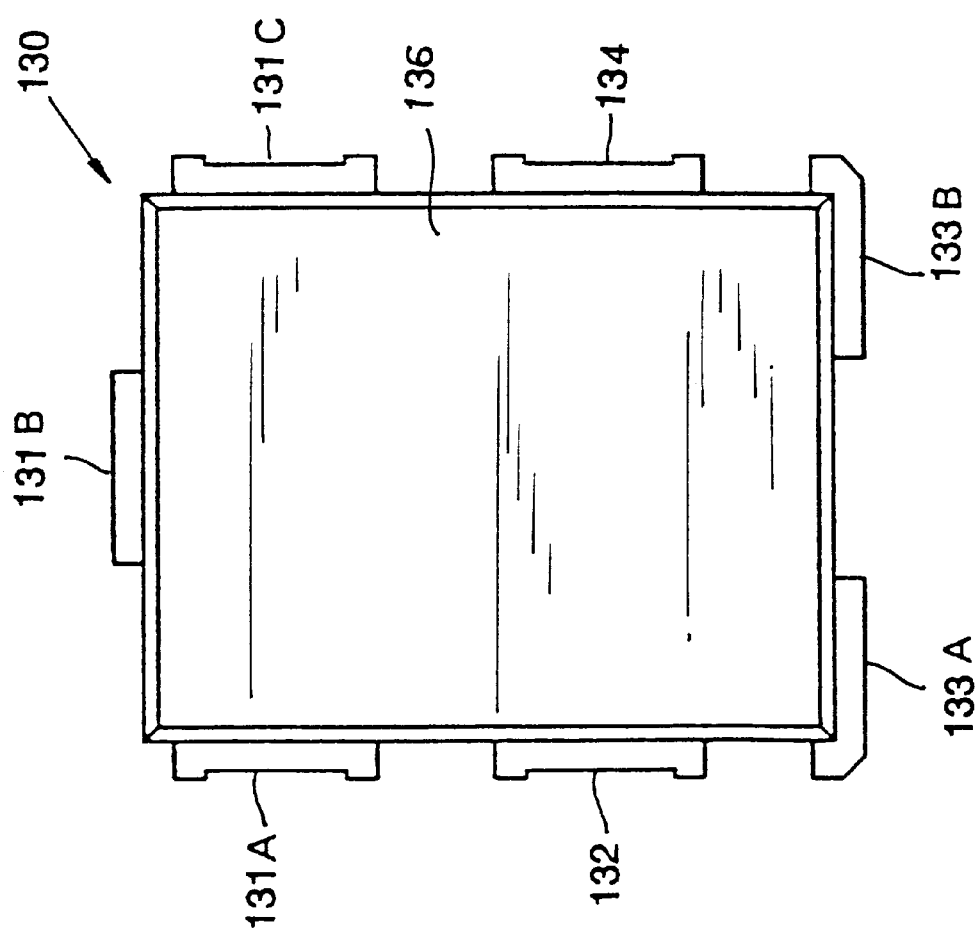

PLURAL SEMICONDUCTOR DIE HOUSED IN COMMON PACKAGE WITH SPLIT HEAT SINK

RELATED APPLICATIONS

This application is related to U.S. application Ser. No. 08/690,500, filed Jul. 31, 1996, now U.S. Pat. No. 5,760,472, which is a continuation of Ser. No. 08/583,219, filed Jan. 4, 1996, now U.S. Pat. No. 5,763,949, both entitled "Surface Mount Semiconductor Package" to Arthur Woodworth, et al. and both assigned to International Rectifier Corporation, the assignee of the present application.

FIELD OF THE INVENTION

This invention relates to semiconductor devices and, more specifically, to a novel device in which a plurality of die, which may be of diverse size and of diverse junction pattern, are fixed to a plural heat sinks held at the same or different potentials and which are enclosed within a common package or housing.

BACKGROUND OF THE INVENTION

Numerous electrical circuits, for example, chopper circuits, synchronous regulator circuits, DC to DC converters, synchronous converters, and the like require a number of semiconductor components such as MOSFETs and Schottky diodes. These components are frequently used in portable electronic apparatus and are commonly separately housed and must be individually mounted on a support board. The separately housed parts take up board space. Further, each part generates heat and, if near other components, such as microprocessors, can interfere with the operation of the microprocessor.

It would be desirable to reduce the board space required by plural semiconductor devices and to reduce part count and assembly costs in power converters and other power subsystems for high-density applications.

It would also be desirable to reduce the board space, part count and assembly costs while accommodating diverse devices that operate at different potentials and while having the capacity to remove heat from the devices.

BRIEF DESCRIPTION OF THE INVENTION

In accordance with the invention, two or more diverse semiconductor die are mounted on plural heat sinks which are laterally spaced and initially formed from a common lead frame with a first one of the power terminals of each die electrically connected to its heat sink. Each heat sink body also has one or more externally available pins which are used to make connection to the first power terminal of each of the diverse die. The die are also provided with one or more second power terminals at the tops of the die. The second power terminals may be connected to one or more respective external pins of the lead frame which are isolated from one another and from the external pins that are connected to the heat sink bodies. The heat sink body may also include a connection pad for connecting the first power terminal of one die to the second power terminal of another die or to one of the isolated external pins. One or more of the die may also contain a control terminal, such as the gate electrode of a MOSFET die, and a further and isolated pin of the lead frame is connected to this gate terminal.

The lead frame and die are then over-molded with a suitable insulation compound housing, with the various pins extending in-line and beyond the edge surfaces of the housing and available for external connection.

The housing may take the form of a surface-mounted housing with a very small "footprint". By way of example, a MOSFET die and a Schottky diode die may be contained within the housing and the drain electrode of the MOSFET and cathode electrodes of the Schottky diode may be soldered to a respective heat sink an interconnected within the housing. The FET source and gate terminals which are located on top of the die are wire bonded to insulated lead frame pins, and the top Schottky diode anode is also connected to an isolated pin so that any desired external or internal connection can be made to the package. Alternatively, other circuits, such as bridges, choppers, and synchronous regulators, may be enclosed in the housing.

The novel package of the invention reduces power dissipation and heat generation near temperature-sensitive parts such as microprocessors. The device also provides substantial savings in board space while reducing component count and assembly costs.

In accordance with the invention, a conductive lead frame supports two or more semiconductor devices and is encapsulated by a molded housing. Two or more laterally spaced main pad areas each have a respective heat sink and at least one external pin that extends from an edge thereof. The external pin extends beyond the boundary of the molded housing and are available for external connection, and the heat sink extends from a bottom surface of the molded housing. At least one isolated pin is disposed along an edge of the molded housing and extends beyond the boundary of the molded housing for external connection. At least one of the main pad areas has an internal bonding region for connecting with another of the main pad areas or to the isolated pin.

The package may include two main pad areas that each have a respective heat sink and may include three isolated pins. The two main pad areas may be disposed along an edge of the molded housing and the isolated pins disposed along an imposing edge of the molded housing. The device may include three main pad areas each having a respective heat sink and one or more external pins.

According to another aspect of the invention, a semiconductor device package houses two or more semiconductor devices. A conductive lead frame includes at least two main pad areas that each have a respective heat sink and a respective pin extending from an edge thereof. At least one isolated pin is separated from the main pad areas and is disposed opposite to the pins. A molded housing encapsulates the lead frame and the semiconductor devices. At least one of the main pad areas has an internal bonding region for connecting with either the other main pad area or an isolated pin. The heat sinks and the pins all extend beyond the boundary of the molded housing for external connection.

The package may include two main pad areas that each have a respective heat sink and the respective pin and may include two or more isolated pins. The package, alternatively may include three or more main pad areas.

According to a further aspect of the invention, two or more semiconductor die of a semiconductor device each have opposing surfaces which contain one or more respective electrodes. A conductive lead frame includes two or more main pad areas that each have a heat sink and at least one pin extending from an edge thereof, and one or more isolated pins separated from the main pad areas and disposed opposite to the pins of the main pad areas. At least one of the main pad areas has an internal bonding region. One opposing surface of each semiconductor die is disposed atop and in electrical contact with a respective one of the main pad areas. Another opposing surface has at least one region that is wire bonded to either the internal bonding region or the isolated pin. A molded housing encapsulates the lead frame, the semiconductor die and the bonding wires. The heat sinks and the pins all extend from the boundary of the molded housing for external connection.

The package may include two main pad areas that each have a respective heat sink and a pin extending therefrom and includes two or more isolated pins. Each of the main pad areas may include an internal bonding pad region.

One of the semiconductor die may be a MOSFET die that has a source, drain and gate electrodes with a drain electrode in contact with the main pad area. Another semiconductor die may be a Schottky diode die having an anode electrode and a cathode electrode with the cathode electrode connected to the main pad area.

A low-side chopper circuit is formed when the gate electrodes of the MOSFET die are connected to respective isolated pins, and the anode of the Schottky diode die is connected to the internal bonding pad of the main pad area that is connected to the drain of the MOSFET die. A high-side chopper circuit is formed when the gate electrode of the MOSFET die and the anode electrode of the Schottky diode die are connected to respective isolated pins and the source electrode of the MOSFET die is connected to the internal bonding region of the main pad area that is connected to the Schottky diode die cathode.

The semiconductor device die may be a pair of MOSFET die which each have a source, drain and gate electrodes with the drain electrodes in contact with the main pad area. A synchronous regulator circuit may be formed when the source and gate electrodes of one MOSFET die and the gate electrode of the other MOSFET die are connected to respective isolated pins, and the source electrode of the other MOSFET die is connected to the internal bonding region of the main pad area that connects it to the drain electrode of the first MOSFET die.

The package may include three main pad areas that each have a heat sink and a pin extending therefrom, and three semiconductor die that are each connected to respective heat sinks. The three semiconductor die may be arranged in a single phase bridge circuit.

Other features and advantages of the present invention will become apparent from the following description of the invention which refer to the accompanying drawings.

BRIEF DESCRIPTION OF THE DRAWINGS

FIGS. 3A–3F are a bottom view, side view, front view, cut-away top view, cross-sectional rear view and cross-sectional side view, respectively, of a device package in which two distinct devices are fixed to two heat sinks, respectively, according to an embodiment of the invention.

FIGS. 4A–4C show a top view, a cross-sectional side view and enlarged top views, respectively, of a strip of plural lead frames from which the lead frames of the embodiment shown in FIGS. 3A–3F are formed.

FIGS. 6A and 6B are a cut-away top view and a cross-sectional side view, respectively, of the package of FIGS. 3A–3F in which a MOSFET die and a Schottky diode die fastened to the respective heat sinks of the lead frame and are also interconnected to form the high-side chopper circuit shown in FIG. 5A.

FIGS. 7A and 7B are a cut-away top view and a cross-sectional side view, respectively, of the package of FIGS. 3A–3F with the MOSFET die and the Schottky diode die fastened to the respective heat sinks of the lead frame and are also interconnected to form the low-side chopper circuit of FIG. 5B.

FIGS. 9A and 9B are a cut-away top view and a cross-sectional side view of the package of FIGS. 3A–3F with two MOSFET die are connected to respective heat sinks and are interconnected to form the synchronous regulator circuit of FIG. 8.

FIGS. 11A and 11B show a top view and a side view of a device package in which the lead frame includes three laterally spaced heat sinks according to a further embodiment of the invention.

DETAILED DESCRIPTION OF THE INVENTION

Figure 1A:
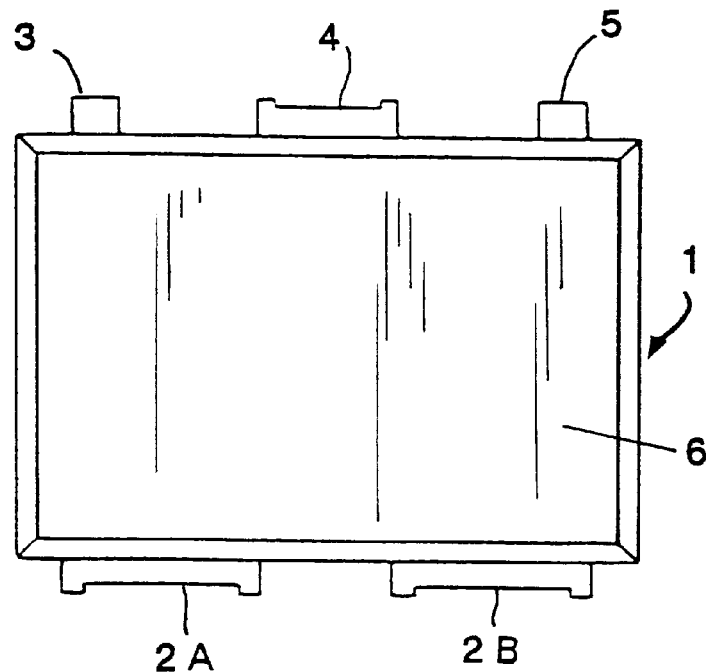
FIGS. 1A and 1B show known device packages in which the lead frame forms a single heat sink.

Referring first to FIG. 1A, there is shown a known surface mount package 1 in which the main pad area of the lead frame forms a single heat sink from which in-line pins 2A and 2B extend from a plastic insulation housing 6. Also included are pins 3, 4 and 5 which are respectively connected to isolated bonding pads (not shown) within the plastic insulation housing 6.

Typically, a semiconductor die, such as a MOSFET die or a Schottky diode die, is mounted with its back surface in contact with the main pad area surface of the heat sink 2 and with its front surface connected by bonding wires that extend from connection pads located on the die to the bonding pads of pins 3, 4 and 5. The die and lead frame are over-molded with a plastic material to form housing 6 with the flat bond surface of heat sink 2 exposed to a surface connection. Alternatively, two or more die may be housed within package 1 with their back surfaces mounted to the common bonding pad area. Such an arrangement is described in (IR-1317).

Figure 1B:
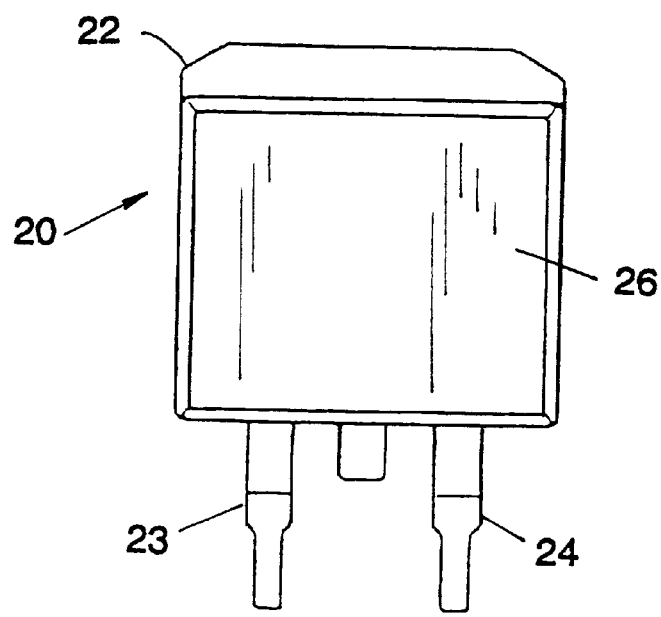

Another conventional surface mounted TO-220 device package 20, is illustrated in a top view in FIG. 1B. Typically, one surface of a semiconductor device is attached to a metal plate 22 (partially shown) which provides thermal contact with the device and may also be electrically connected to the device. An opposing surface of the device is connected to one or more of the lead terminals 23 and 24 by wire bonds. The device and a portion of the metal plate 22 and the lead terminals 23 and 24 are encapsulated in a package body 26, typically formed of resin.

Figure 2:
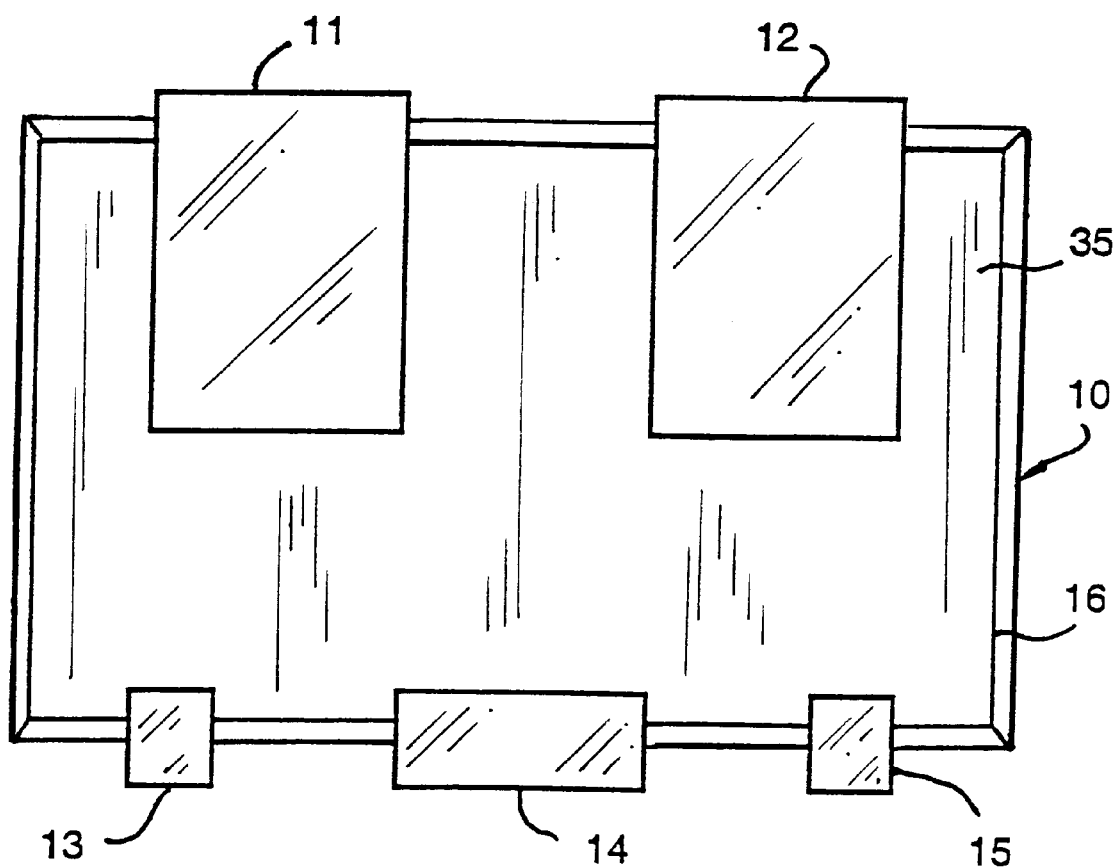
FIG. 2 is a bottom view of a device package according to an embodiment of the invention in which the lead frame includes two laterally spaced heat sinks.

FIG. 2 shows a surface mount package 10 according to the present invention. Here, the lead frame includes two laterally spaced heat sinks 11 and 12 onto which two devices are respectively mounted. Electrically isolated pins 13, 14 and 15 provide additional external connections and extend from plastic insulation housing 16.

Figure 3F:
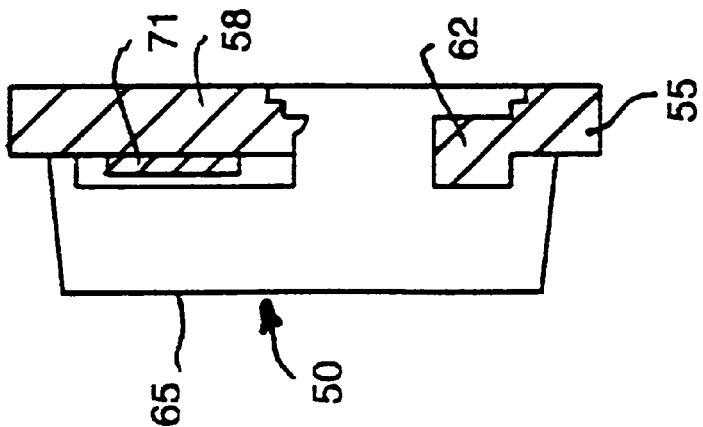
Figure 3D:
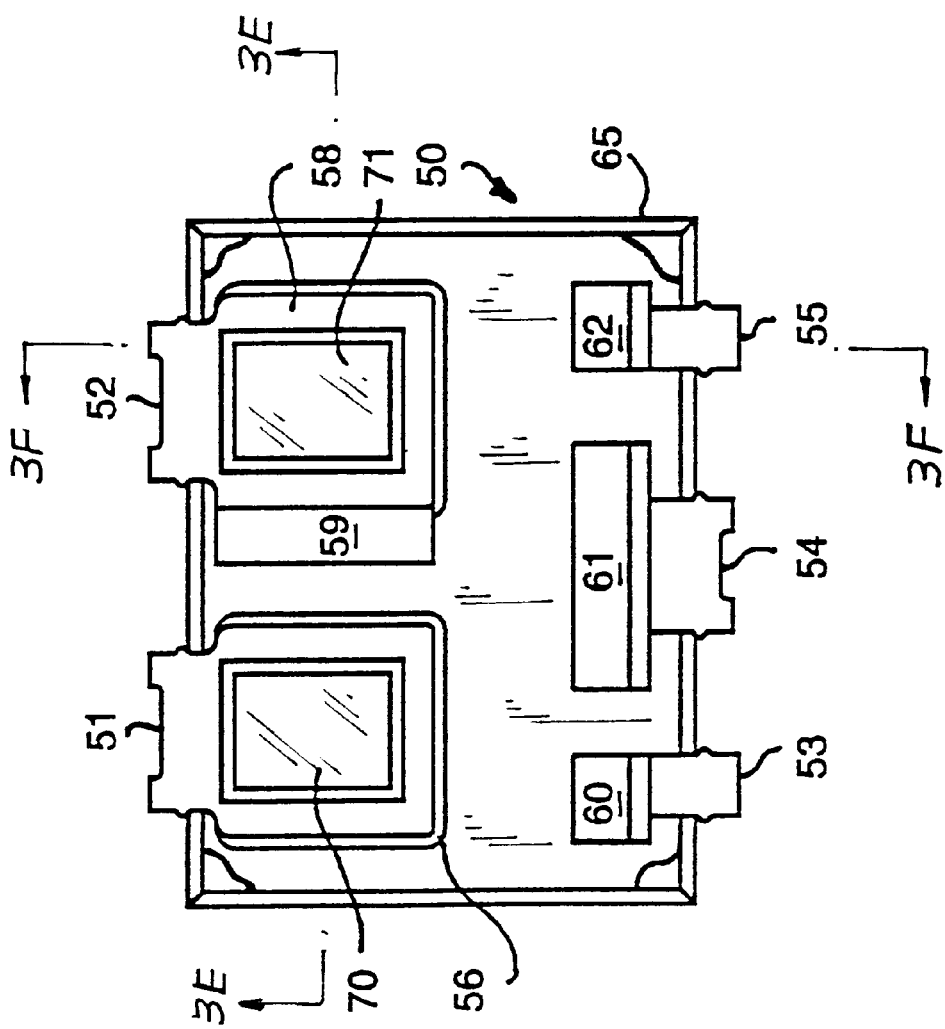

FIGS. 3A–3F show the internal configuration of the lead frame of device package 50 according to an embodiment of the invention. Particularly, FIG. 3D shows the back surface of a semiconductor die 70 mounted onto the bonding pad surface of heat sink 56. Heat sink 56 is also provided with an external pin 51 for electrically connecting the back surface of die 70 to one or more of bonding pads 60, 61 and 62 of pins 53, 54 and 55, respectively, or to another heat sink.

Similarly, the back surface of die 71 is mounted to the bonding pad surface of heat sink 58 which is also provided with external pin 52. Heat sink 58 is also provided with an integral bonding pad 59 for providing wire bond connections to one or more of pins 60, 61 and 62. Both of heat sinks 56 and 58 extend outside of package housing 65 as FIGS. 3A, 3C, 3D, 3E and 3F show.

Figure 4B:
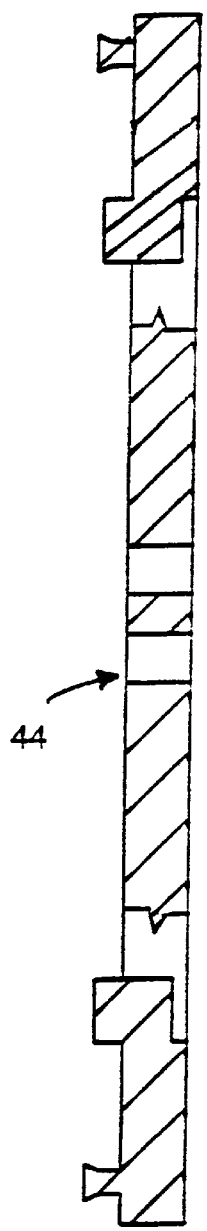
Figure 4C:
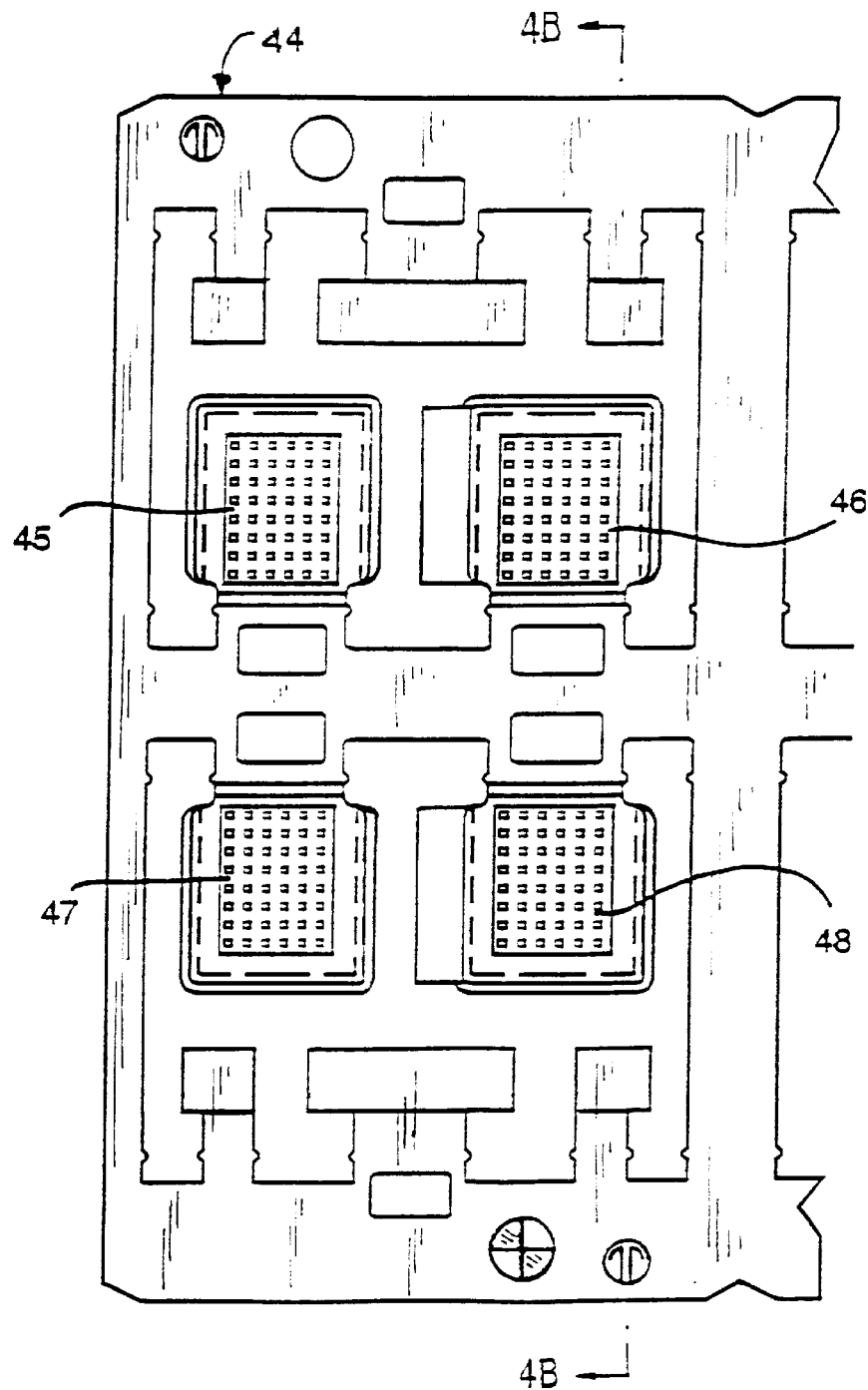

FIG. 4A shows a strip 44 of a number of the lead frames used in the package shown in FIGS. 3A–3F together with the connecting supports that initially hold the lead frames together. The lead frames are shown in greater detail in FIGS. 4B and 4C. Each of the frames includes two main pad areas to which a pair of devices, such as semiconductor device die 45 and 46 or 47 and 48 are attached. The internal connecting supports between portions of the lead frame are removed prior to molding the plastic housing, and the external connecting supports may be removed after molding. FIG. 4B shows a side view of the lead frame and its connecting supports.

The heat sink arrangement of the device package 50 provides the advantage that two semiconductor die are housed in a common package but are bonded to respective heat sinks. Thus, the two die may be held at different potentials or at the same potential. Additionally, the common package reduces printed circuit board space usage while permitting the removal of heat from the die.

Figure 5B:
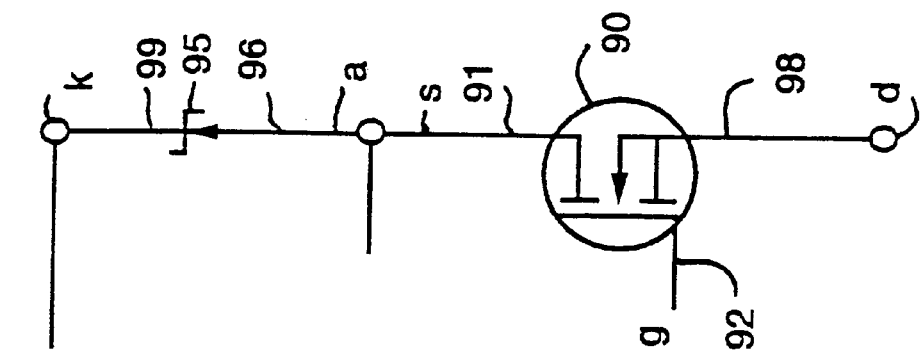
FIGS. 5A and 5B are circuit diagrams showing a high side chopper circuit and a low side chopper circuit, respectively.
Figure 5A:
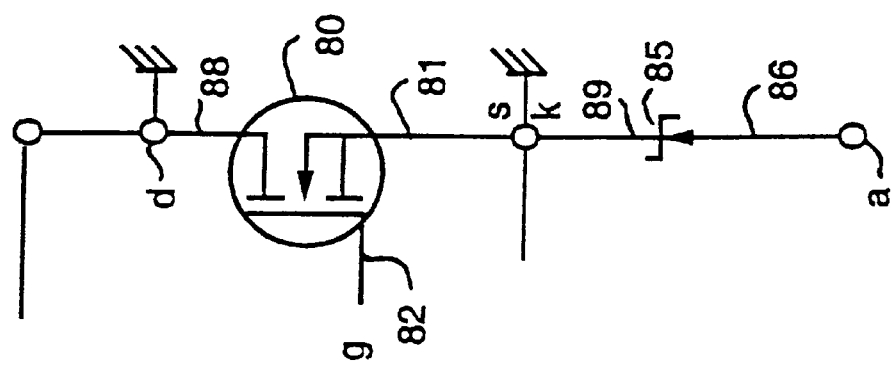

FIG. 5A shows a known high-side chopper circuit formed by connecting the source 81 of MOSFET die 80 to the cathode 89 of Schottky diode die 85. The two die may be housed in the semiconductor package 50 of FIGS. 3A–3F in the manner shown in FIGS. 6A and 6B. In this embodiment, the drain 88 of MOSFET 80 is electrically connected to the main pad area of heat sink 56 and provided with an external connection via pin 51. The cathode 89 of Schottky diode 85 is similarly electrically connected to the main pad area of heat sink 58 and provided with an external connection by pin 52. The gate 82 of MOSFET 80 and the anode 86 of Schottky diode 85 are connected by the wire bonds 101 and 103 to isolated pins 53 and 54, respectively. Isolated pin 55 is not used. The source 81 of MOSFET 80 is connected to cathode 89 of Schottky diode 85 by wire bond 102 which extends from source 81 to internal pad 59.

Referring back to FIG. 5B, a conventional low-side chopper circuit in which the source 91 of MOSFET die 90 is connected to the anode 96 of Schottky diode die 95 is shown. FIGS. 7A and 7B show the two die mounted in the lead frame of FIGS. 3A–3F. Here, the source 91 and gate 92 of MOSFET 90 are connected by wire bonds 106 and 107 to isolated pins 53 and 54, respectively, and the anode 96 of Schottky diode die 95 is connected by wire bonds 105 to the drain of MOSFET die 90 via internal bonding pad 59.

Figure 8:
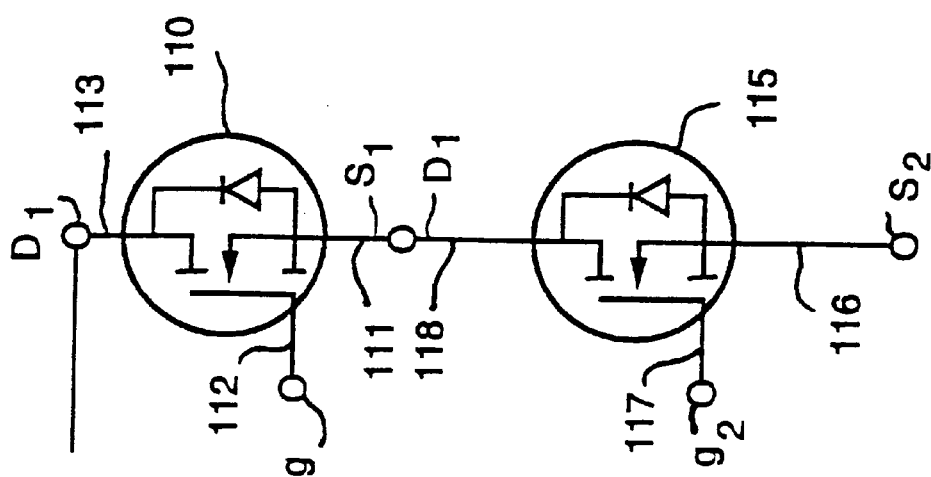
FIG. 8 is a circuit diagram of a synchronous regulator circuit.

FIG. 8 shows a synchronous regulator circuit in which the source 111 of a first MOSFET 110 is electrically connected to the drain 118 of a second MOSFET 115. FIGS. 9A and 9B show the circuit of FIG. 8 mounted in the package of FIGS. 3A–3F. The connection between the source 111 of first MOSFET 110 and the drain of second MOSFET 115 is provided by wire bonds 131 via internal bonding pad 59 of heat sink 58. In this example, all three isolated external pins 53, 54 and 55 are used. Pin 55 provides an external connection to the gate 112 of the first MOSFET die 110 using wire bond 130 to connect the gate 112 to bonding pad 60. Similarly, isolated pin 54 provides an external connection to the source 116 of the second MOSFET die 115 using wire bond 132 to connect the source 116 to bonding pad 61. Isolated pin 55 provides a similar connection between the gate 117 of the second MOSFET die 115 and the bonding pad 62 by wire bond 133. Heat sinks 56 and 58 and their respective external pins 51 and 52 provide external connections for the drains 113 and 118, respectively, of the first and second MOSFETs 110 and 112.

Figure 10:
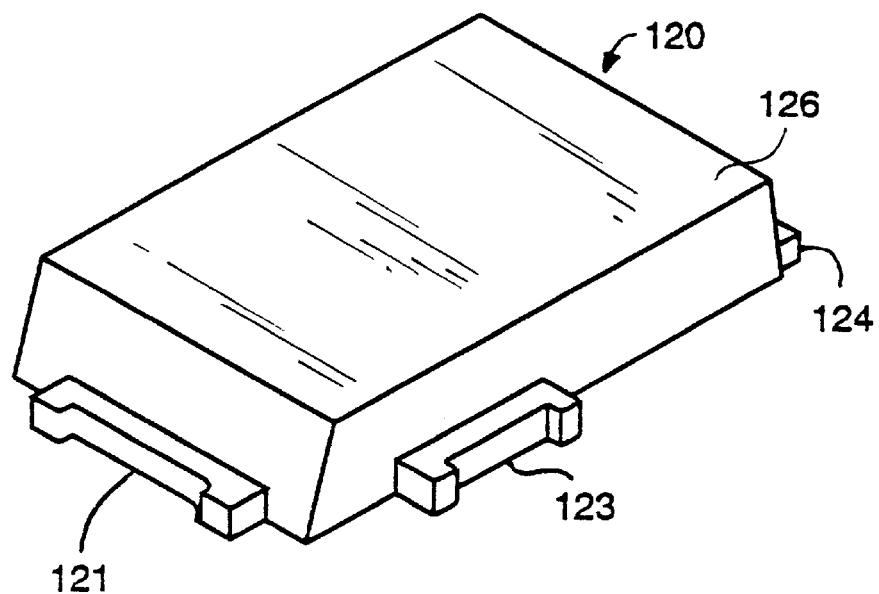
FIGS. 10A and 10B are perspective views of a device package according to another embodiment of the invention in which the lead frame includes three laterally spaced heat sinks.
Figure 10:
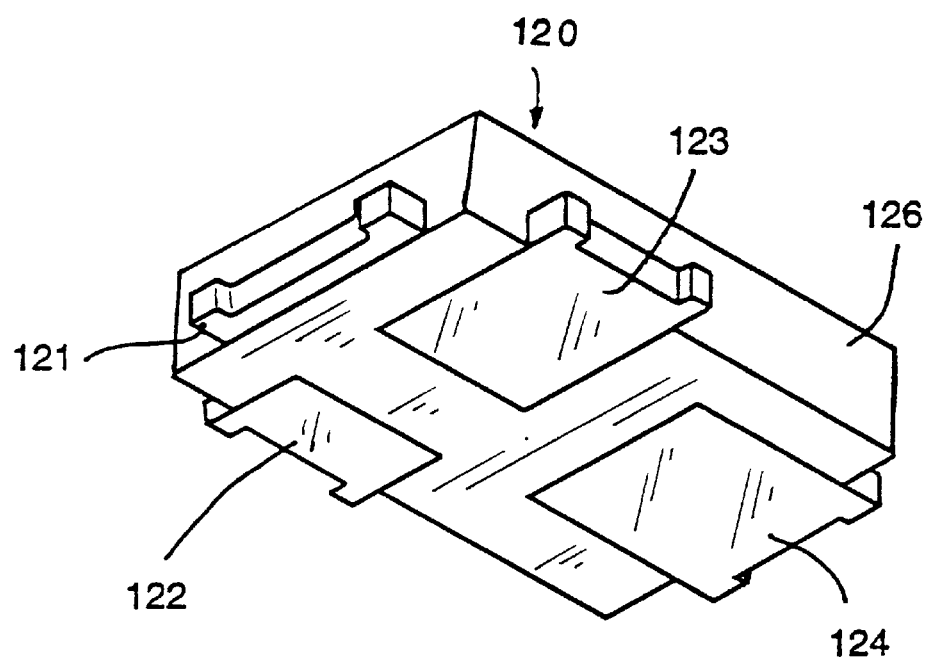

FIGS. 10A and 10B show another example of the invention which is suitable for housing three semiconductor devices. Three isolated heat sinks 122, 123 and 124 are laterally spaced and enclosed in a plastic molding 126 to form a common package 120. The three devices are each bonded to a respective heat sink. Internal connecting pads are provided in a manner similar to those shown in FIGS. 3A–3F. Also included is an isolated external pin 121. This package is suitable for housing a single-phase or single-mode (SM) bridge or for other circuits in which three discrete devices are held at the same or at different potentials.

FIGS. 11A and 11B show a further embodiment of a device package 130 which includes three isolated heat sinks. FIG. 10A depicts a top view of the device package 130 and shows protruding portions 131A, 131B and 131C of a first heat sink as well as protruding portions 132 and 134 of the remaining two heat sinks, respectively. The three isolated heat sinks protrude through the bottom surface of the package and are encapsulated in a plastic molding 136. Each of the heat sinks also includes an internal connecting pad which are configured in a manner similar to those shown in FIGS. 3A–3F. Up to three respective devices are each bonded to a respective one of the heat sinks. The package is suitable for housing a single-phase or single-mode bridge or other three device circuits.

Figure 12:
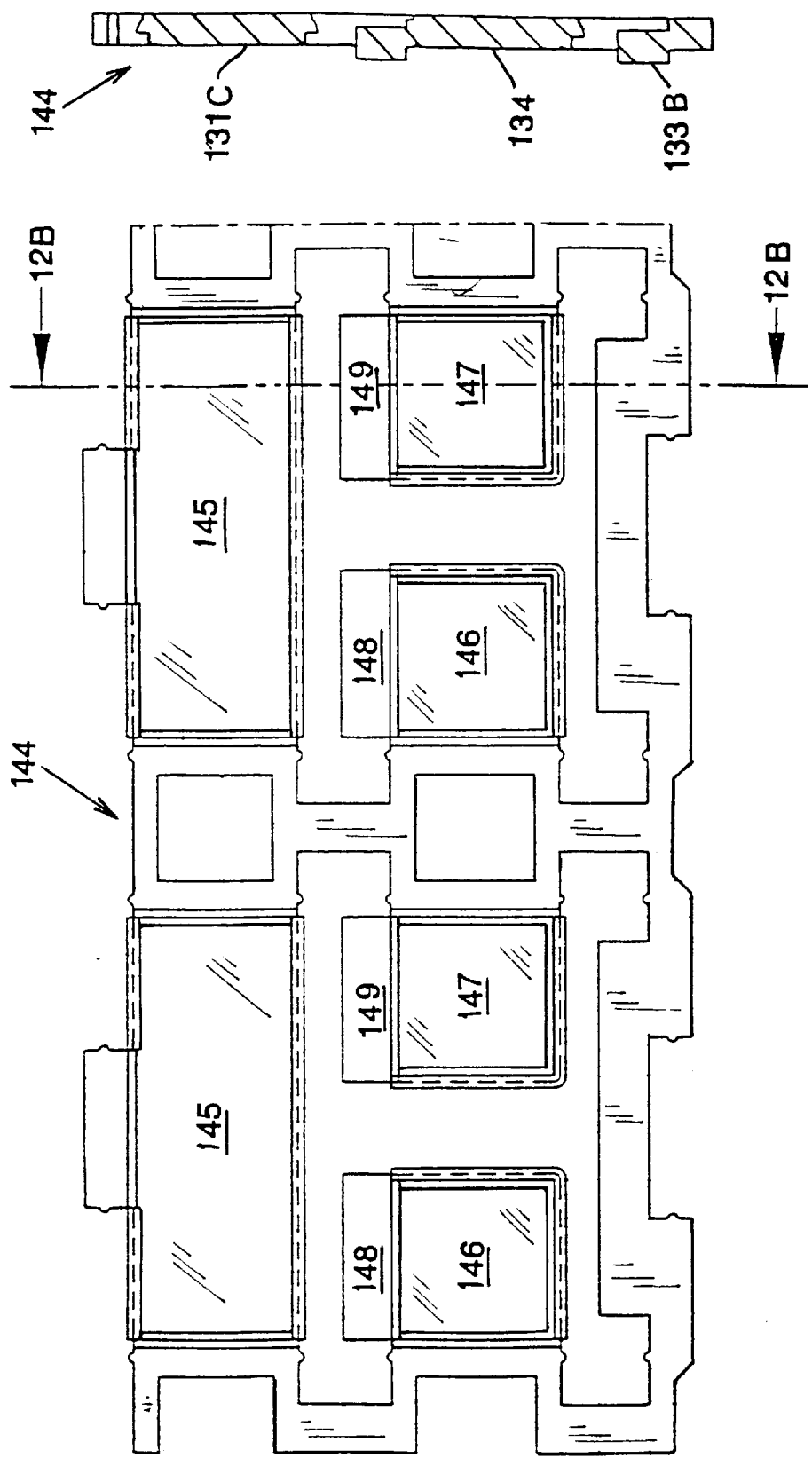
FIGS. 12A and 12B are top and cross-sectional views, respectively, of a strip of plural lead frames used in the device package of the embodiment shown in FIGS. 11A–11B.

FIG. 12A shows a strip that includes two of the lead frames which are subsequently trimmed when included in the package 130 shown in FIG. 11A. Each lead frame includes three main pad areas 145, 146 and 147 to which respective devices are bonded. Also provided with two of the heat sinks are internal bonding pads 148 and 149 for electrically connecting the back surface of the dies bonded to bonding pads 146 and 147, respectively, to the front surface of one or more of the other die. FIG. 12B shows a cross-sectional side view of the lead frame 144.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A conductive lead frame for supporting two or more semiconductor devices and encapsulated by a molded housing; said lead frame comprising:

at least two laterally spaced main pad areas each having a respective heat sink and at least one external pin extending from an edge thereof, said heat sink extending from a bottom surface of said molded housing and said external pin extending beyond the boundary of said molded housing for external connection; and at least one isolated pin disposed along an edge of said molded housing and extending beyond the boundary of said molded housing for external connection;

at least one of said main pad areas having an internal bonding region that is connectable with another of said main pad areas and that is connectable with said at least one isolated pin.

2. The lead frame of claim 1, wherein said lead frame comprises two main pad areas each having a respective heat sink and further comprises three isolated pins.

3. The lead frame of claim 2, wherein said two main pad areas are disposed along an edge of said molded housing and said isolated pins are disposed along an opposing edge of said molded housing.

4. The lead frame of claim 1, wherein said lead frame comprises three main pad areas each having a respective heat sink and each having at least one external pin extending from an edge thereof.

5. A semiconductor device package for housing two or more semiconductor devices; said device package comprising:

a conductive lead frame that includes at least two main pad areas each having a respective heat sink and a respective external pin extending from an edge thereof, and at least one isolated pin separated from said at least two main pad areas and disposed opposite to said pins of said at least two main pad areas; and a molded housing for encapsulating said lead frame and said semiconductor devices;

at least one of said at least two main pad areas having an internal bonding region that is connectable with another of said at least two main pad areas and that is connectable with said at least one isolated pin;

said heat sinks extending beyond a bottom surface of said molded housing, and said pins of said at least two main pad areas and said isolated pins extending beyond the boundary of said molded housing for external connection.

6. The package of claim 5, wherein said lead frame comprises two main pad areas each having a respective heat sink and a respective external pin and further comprises at least two isolated pins.

7. The package of claim 5, wherein said lead frame comprises three main pad areas each having at least one external pin extending from an edge thereof.

8. A semiconductor device comprising:

at least two semiconductor die each having opposing surfaces which each contain at least one respective electrode;

a conductive lead frame that includes at least two main pad areas each having a heat sink and at least one external pin extending from an edge thereof, and at least one isolated pin separated from said at least two main pad areas and disposed opposite to said pins of said at least two main pad areas;

at least one of said at least two main pad areas having an internal bonding region;

one of said opposing surfaces of each of said at least two semiconductor die being disposed atop and in electrical contact with a respective one of said at least two main pad areas;

another of said opposing surfaces of each of said at least two semiconductor die having at least one region that is wire bonded to one of said internal bonding regions and said isolated pin; and a molded housing for encapsulating said lead frame, said at least two semiconductor die and said bonding wires;

said heat sinks and said pins of said at least two main pad areas and said isolated pins extending beyond the boundary of said molded housing for external connection.

9. The device of claim 8, wherein said lead frame further comprises two main pad areas each having a respective heat sink and a pin extending therefrom and further comprises at least two isolated pins.

10. The device of claim 9, wherein one of said at least two semiconductor die is a MOSFET die having a source, drain and gate electrodes, the surface of said die that is in contact with said respective main pad area being said drain electrode.

11. The device of claim 10, wherein another one of said at least two semiconductor die is a Schottky diode die having an anode electrode and a cathode electrode, the surface of said die that is in contact with said respective main pad area being said cathode electrode.

12. The device of claim 11, wherein said source and gate electrodes of said MOSFET die are connected to respective ones of said at least two isolated pins, and said anode of said Schottky diode die is connected to the internal bonding pad of the main pad area that is connected to said drain of said MOSFET die, such that said MOSFET die and said Schottky diode die form a low-side chopper circuit.

13. The device of claim 11, wherein said gate electrode of said MOSFET die and said anode electrode of said Schottky diode die are connected to respective ones of said at least two isolated pins, and said source electrode of said MOSFET die is connected to the internal bonding region of the main pad area that is connected to the cathode of said Schottky diode die, such that said MOSFET die and said Schottky diode die form a high-side chopper circuit.

14. The device of claim 8 wherein said lead frame comprises at least two main pad areas each having a respective heat sink and a respective external pin extending therefrom and further comprises three isolated pins.

15. The device of claim 14, wherein said at least two semiconductor device die are first and second MOSFET die, each having a source, drain and gate electrodes, the surface of each of said die that is in contact with said respective main pad area being said drain electrode.

16. The device of claim 15, wherein said source and gate electrodes of one of said MOSFET die and said gate electrode of another of said MOSFET die are connected to respective ones of said isolated pins, and said source electrode of said another MOSFET die is connected to said internal bonding region of said main pad area that is connected to said drain electrode of said one MOSFET die, such that said two MOSFET die form a synchronous regulator circuit.

17. The device of claim 8, further comprising three main pad areas each having a heat sink and a pin extending therefrom, and three semiconductor die each connected to a respective one of said heat sinks.

18. The device of claim 17, wherein said three semiconductor die are arranged to form a single phase bridge circuit.

* * * * *